(12) United States Patent
Colburn et al.

(10) Patent No.: US 8,338,952 B2
(45) Date of Patent: *Dec. 25, 2012

(54) INTERCONNECT STRUCTURES WITH TERNARY PATTERNED FEATURES GENERATED FROM TWO LITHOGRAPHIC PROCESSES

(75) Inventors: Matthew E. Colburn, Hopewell Junction, NY (US); Elbert Huang, Carmel, NY (US); Satyanarayana V. Nitta, Poughquag, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

This patent is subject to a terminal disclaimer.

(21) Appl. No.: 12/538,114

(22) Filed: Aug. 8, 2009

(65) Prior Publication Data

US 2009/0294982 A1 Dec. 3, 2009

Related U.S. Application Data

(62) Division of application No. 11/750,892, filed on May 18, 2007, now abandoned.

(51) Int. Cl.
*H01L 21/70* (2006.01)
*H01L 23/48* (2006.01)
*H01L 23/52* (2006.01)
*H01L 29/40* (2006.01)

(52) U.S. Cl. ........ 257/758; 257/506; 257/508; 257/773; 257/774; 257/E23.145

(58) Field of Classification Search .................. 257/774, 257/506, 773, 508, 758, E23.145, E23.151
See application file for complete search history.

(56) References Cited

U.S. PATENT DOCUMENTS

| | | | |
|---|---|---|---|
| 4,491,628 A | 1/1985 | Ito et al. | |
| 6,282,455 B1 | 8/2001 | Engdahl | |
| 6,323,117 B1 | 11/2001 | Noguchi | |
| 6,391,757 B1 | 5/2002 | Huang et al. | |
| 6,627,926 B2 * | 9/2003 | Hartswick et al. | 257/211 |
| 6,661,106 B1 * | 12/2003 | Gilmour et al. | 257/797 |
| 6,693,355 B1 * | 2/2004 | Grove | 257/758 |
| 6,748,704 B2 | 6/2004 | Eguchi et al. | |
| 7,309,649 B2 * | 12/2007 | Colburn et al. | 438/639 |
| 7,361,991 B2 * | 4/2008 | Saenger et al. | 257/750 |

(Continued)

OTHER PUBLICATIONS

Nitta, et al.,"Successful Dual Damascene Integration of Extreme Low K Materials (k<2.0) Using a Novel Gap Fill Based Integration Scheme", Dec. 2004, IBM T.J. Watson Research Center, Yorktown Heights, NY, IBM Almaden Research Center, San Jose, CA.

(Continued)

*Primary Examiner* — Teresa M Arroyo
(74) *Attorney, Agent, or Firm* — Scully, Scott, Murphy & Presser, P.C.; Daniel P. Morris, Esq.

(57) ABSTRACT

A method for fabricating an interconnect structure for interconnecting a semiconductor substrate to have three distinct patterned structures such that the interconnect structure provides both a low k and high structural integrity. The method includes depositing an interlayer dielectric onto the semiconductor substrate, forming a first pattern within the interlayer dielectric material by a first lithographic process that results in both via features and ternary features being formed in the interconnect structure. The method further includes forming a second pattern within the interlayer dielectric material by a second lithographic process to form line features within the interconnect structure. Hence the method forms the three separate distinct patterned structures using only two lithographic processes for each interconnect level.

5 Claims, 3 Drawing Sheets

U.S. PATENT DOCUMENTS

| | | | |
|---|---|---|---|
| 7,595,554 B2 * | 9/2009 | Yang | 257/750 |
| 7,915,162 B2 * | 3/2011 | Anderson et al. | 438/653 |
| 2002/0054101 A1 | 5/2002 | Beatty | |
| 2003/0087518 A1 | 5/2003 | Chen et al. | |
| 2004/0094821 A1 | 5/2004 | Lur et al. | |
| 2004/0266169 A1 | 12/2004 | Sakata | |
| 2006/0026558 A1 | 2/2006 | Beringer et al. | |
| 2006/0038297 A1 * | 2/2006 | Usami et al. | 257/758 |
| 2006/0169415 A1 | 8/2006 | Lawson et al. | |
| 2006/0216920 A1 * | 9/2006 | Kojima | 438/618 |
| 2006/0267208 A1 * | 11/2006 | Colburn et al. | 257/774 |
| 2007/0045860 A1 * | 3/2007 | Nakamura | 257/774 |
| 2007/0182013 A1 * | 8/2007 | Zhu | 257/751 |
| 2008/0171432 A1 * | 7/2008 | Clevenger et al. | 438/619 |
| 2008/0185728 A1 * | 8/2008 | Clevenger et al. | 257/774 |
| 2008/0220615 A1 * | 9/2008 | Brunner et al. | 438/735 |
| 2009/0200683 A1 * | 8/2009 | Colburn et al. | 257/774 |
| 2010/0181677 A1 * | 7/2010 | Edelstein et al. | 257/773 |
| 2010/0230820 A1 * | 9/2010 | Ueda | 257/759 |
| 2011/0021017 A1 * | 1/2011 | Ueda | 438/622 |
| 2011/0049724 A1 * | 3/2011 | Anderson et al. | 257/773 |

OTHER PUBLICATIONS

Yang, et al., "High Performance CMOS Fabricated on Hybrid Substrate With Different Crystal Orientations", IEDM 03-453, pp. 18.7.1-18.7.4.

* cited by examiner

INTERCONNECT STRUCTURES WITH TERNARY PATTERNED FEATURES GENERATED FROM TWO LITHOGRAPHIC PROCESSES

CROSS-REFERENCE TO RELATED APPLICATIONS

This application is a divisional of U.S. patent application Ser. No. 11/750,892, filed May 18, 2007.

BACKGROUND

The present invention relates to interconnect structures and methods to generate interconnect structures that are part of integrated circuits and microelectronic devices. The invention is based on the utilization of two distinct lithographic steps to create a structure having three distinct patterns. By repeating these processes, unique interconnect structures having enhanced mechanical or electrical properties are described. Exemplary methods for the fabrication of such structures are enclosed.

The fabrication of Very-Large Scale Integrated (VLSI) or Ultra-Large Scale Integrated circuits (ULSI) requires an interconnect structure comprised of metallic wiring that connects individual devices in a semiconductor chip, to one another. Typically, the wiring interconnect network consists of two types of features that serve as electrical conductors: line features that traverse a distance across the chip, and via features, which connect lines in different levels. Typically, both the line and via features comprise conducting metal lines of aluminum or copper, and are insulated by interlayer dielectric, ILD, which is an electrical insulator such as silicon dioxide ($SiO_2$), or fluorine or carbon doped silica film deposited by plasma enhanced chemical vapor deposition (PECVD).

For interconnect fabrication, a number of key factors must be considered including performance, reliability, and cost. The first factor, or performance of an interconnect structure, is significantly affected by signal propagation delays, which are proportional to the product of the metal resistance, R, and the interconnect capacitance, C, of the metallic vias and lines. Thus, in order to reduce these delays, it is advantageous to minimize both the resistivity of the conducting metal and the capacitance resulting inherently in the spatial relationship between the conducting metal, i.e., the metallic lines and vias and the inherent characteristics of the insulating material surrounding and disposed between the metallic lines and vias. Minimizing such capacitance may be achieved by implementing materials having lower dielectric constant (k).

Historically, the interlayer dielectric has been silicon dioxide with a dielectric constant (k) equal to approximately 4.2. Decreasing the dielectric constant of an insulating material (or dielectric) has the effect of decreasing a capacitance related to its use. Recently, there has been a significant effort for implementing dielectric materials having lower dielectric constants including fluorinated glass (k~3.8), carbon doped oxides (k~2.8), etc. in expectation of realizing reduced capacitance. To decrease the dielectric constant even further (k~1.8-2.4), porosity has been engineered into insulator materials in order to replace a portion of the material with air (k=1). Finally, it has been proposed that the entire insulator may be substituted with air in regions between conducting metal lines (i.e., air bridge) to minimize the capacitance between these features.

The second key performance factor, or reliability of the interconnect structures is of critical importance for IC operation, e.g., VLSIs and ULSIs. Unfortunately, with the driving need to reduce the capacitance in interconnect structures, the mechanical robustness of the multilayer structures is being reduced by the use of these lower dielectric constant insulating materials. That is, the newer materials being used as insulators for their lower k undesirably exhibit lower modulus and strength. This becomes even a greater concern as porosity is added into the interlayer dielectric, or when air gaps are incorporated since the strength of the interconnect structure can be greatly compromised by the effects of lower modulus and strengths of the dielectrics used. Compromising the interconnect structures renders them susceptible to failure during the subsequent fabrication processes, affecting wafer yield.

The third key factor, or the cost for manufacturing the interconnect structures is important. Manufacturing a semiconductor, particularly a VLSI or ILSI design, is a complex process comprising multiple integrated sub-processes and operations. Integration schemes involving such excessive and numerous processes can be cost prohibitive. Lithographic processes can be especially expensive due to the combination of costs associated with tooling, masks, photoresists, developers, etc. For example, the inherent manufacturing cost for air gap fabrication in interconnect structures may be an important consideration as a third mask set is often needed to implement same in addition to the line and via mask set within intended regions.

For interconnect structures comprising copper lines and vias, the typical fabrication approach for a semiconductor design uses what is referred to as a "dual damascene process." By a dual damascene process, lines and vias are patterned by lithographic processes into photoresists, and the photoresists transferred into the interlayer dielectric to create a structure having topographical features corresponding to each of these patterns. Metal containing liner (that serves as a copper diffusion barrier) and copper is then deposited onto the structure. The structure is subsequently polished down to the interlayer dielectric to remove excess from the structure. Commonly, a copper diffusion barrier that is an electrical insulator is then deposited upon the structure so formed. This process may be repeated multiple times to create the interconnect structure, which as mentioned serves as the wiring network for the microelectronics being fabricated.

One approach of the dual damascene process is a "via-first" approach. Applying a via-first approach includes that the lithography corresponding to the via fabrication is performed prior to that required for the line lithography. An example of such a via-first scheme or approach is described as follows with respect to the steps outlined in FIGS. 1a-1e. Referring now to FIG. 1a, first and interlayer dielectric (100), and optionally, a hard mask (200) are deposited on a substrate (10). The via lithography is performed, and the via pattern (50) is transferred into the interlayer dielectric by reactive ion etch. Next, and FIG. 1b shows that a via filling material (300) is applied in order to planarize the substrate surface, and an optional hardmask (400) may be deposited as shown in FIG. 1c. Line lithography is then performed on the structure so far, and a line pattern (70) is transferred into the interlayer dielectric (100) as shown in FIG. 1d. Finally, and as shown in FIG. 1e, a metal containing liner (500) and copper (600) is deposited into the structure, which is subsequently planarized by chemical mechanical polishing or planarization (CMP). A cap barrier (700) that serves as a copper and air diffusion barrier is then deposited. These series of steps are repeated to form a multilayered interconnect structure comprised multiple levels of lines and vias.

Numerous variations exist to generate these interconnect structures. However, in general the conventional approaches involve two separate lithographic processes to generate the via and line patterns that are distinct and different. In damascene processing, in contrast to subtractive aluminum technology, the dielectric material is deposited first as a blanket film and is patterned and etched leaving holes or trenches. In "single damascene" processing, copper is then deposited in the holes or trenches surrounded by a thin barrier film resulting in filled vias or wire "lines" respectively. In "dual damascene" technology, both the trench and via are fabricated before the deposition of copper resulting in formation of both the via and line simultaneously, further reducing the number of processing steps. Thus, for each dual damascene level, a binary structure having distinct structures defined by the via and line patterning is usually afforded.

Approaches to generate ternary interconnect structures whereby three distinct features are defined by three separate lithographic processes (i.e., exposures) have also been proposed. Examples of this are interconnecting structures that are fabricated to include airgap structures or airgaps, which are patterned in a separate lithography step using known and conventional semiconductor fabrication techniques. For interconnects involving airgaps, this third separate lithographic process is generally required because airgaps must be omitted in regions within an interconnect design or structure where their inclusion would result in degraded reliability or mechanical failure of same. (Arnal et al, IEDM 2001). Consequently, such approaches are generally not manufacturable however as a result of added lithographic process which can be cost prohibitive. Furthermore, since three lithographic processes would be employed to add the airgap structures in specific portions of the interconnect structures, significant complications may result which may or may not be anticipated, including to name one, overlay misalignment resulting from the three separate patterning steps.

BRIEF SUMMARY

This invention relates to a novel interconnect structure that includes ternary features in a form of airgap structures, and support structures without air gaps for use in semiconductor integrated circuits (ICs), and to methods that are utilized in forming the interconnect structures. The novel interconnect structures are envisioned to be used within any semiconductor ICs, and particularly suited VLSI or ULSI designs that can benefit from reduced capacitances as a result of a lower k displayed by the interconnect structure, which semiconductors can be employed in any microelectronic device including: high speed microprocessors, application specific integrated circuits (ASICs), and memory storage. Incorporating the novel interconnect structure, and implementing the novel method for constructing the structures will realize a unique semiconductor IC structure with numerous advantages over structures that produced using current approaches including: reduced manufacturing costs, improved reliability, and enhanced device performance.

More specifically, the invention relates to the generation of novel interconnect structures where each level contains three distinct features, and that the three distinct features may be defined or incorporated into the IC structure using only two lithographic processes. Two of these features are the conventionally known conducting metal vias and lines used to transfer electrical signals across the chip in operation, as described above. More, and as mentioned above, providing the metallic lines and vias requires two lithographic processes. The third feature or ternary feature in accord with the invention provides an improvement in the interconnect structure that manifests in enhanced performance or reliability. The ternary feature exhibits its value in many ways, and in particular in view of its structural support as part of the interconnect structure. For that matter, its use allows the designer to use porous materials that might not normally display sufficient modulus and strength such as porous dielectrics. Alternatively, the ternary feature can be an airgap that is generated by from a sacrificial material that can be readily removed from interconnect structures during fabrication.

The novel ability of forming three distinct features in a semiconductor interconnect structure using only two lithographic processes is implemented as a concatenation of the dual processes known in view of the coincidence of the two patterns required to generate the metal lines and vias. The novel method of the invention includes that the metallic lines are defined solely by the line lithography process, wherein the vias are defined in regions where the patterns corresponding to the lines and the via lithography coincide. The ternary features are defined by patterns in the via lithography that do not coincide with the line patterns, and are implemented in the via lithography process.

Other and further objects, advantages and features of the present invention will be understood by reference to the following specification in conjunction with the annexed drawings, wherein like parts have been given like numbers. The reader and skilled artisan alike should note that the examples used in the specification are provided for explanatory purposes only, and as such should not be interpreted to limit the scope and spirit of the invention in any way.

BRIEF DESCRIPTION OF THE SEVERAL VIEWS OF THE DRAWINGS

The foregoing and other objects, aspects and advantages will be better understood from the following detailed description of embodiments of the inventions, with reference to the drawings, in which.

DETAILED DESCRIPTION

Figure 1A:
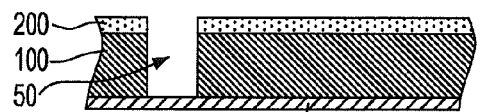
FIGS. 1a-1e are schematic diagrams which together depict the generation of an interconnect structure (prior art) for use within semiconductor integrated circuit (IC) devices.
Figure 1B:
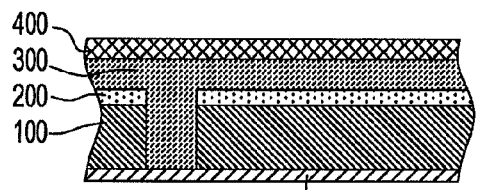
Figure 1C:
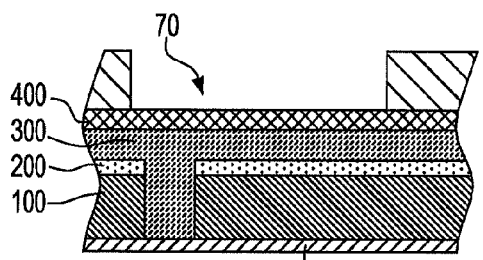
Figure 1D:
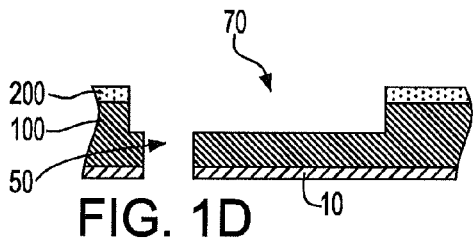
Figure 1E:
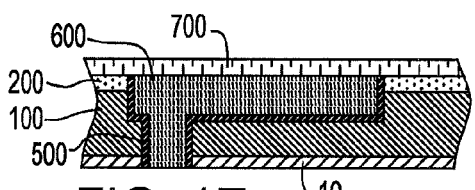

A detailed description of a method for generating ternary interconnect structures for use in semiconductor ICs or microelectronic devices is presented below.

Referring to FIGS. 2a-2e, the novel method for generating a interconnect structure (A) of this invention will be explained. The structure shown in FIG. 2a comprises a semiconductor substrate layer 10 upon which is an interlayer dielectric (100) and an optional hard mask (200) layered thereon. A first lithographic step is performed to generate a mask having via feature (50) and ternary feature (90) within the interlayer dielectric (100) and optional hard mask (200).

Figure 2A:
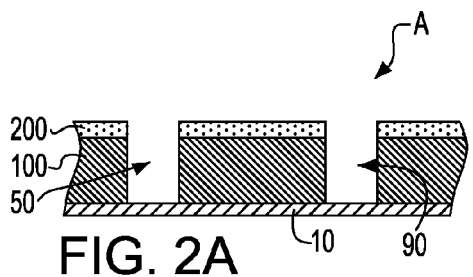
FIGS. 2a-2e are schematic diagrams, which together depict one embodiment of a method for generating a ternary interconnect structure having three structurally distinct features of this invention.
Figure 2E:
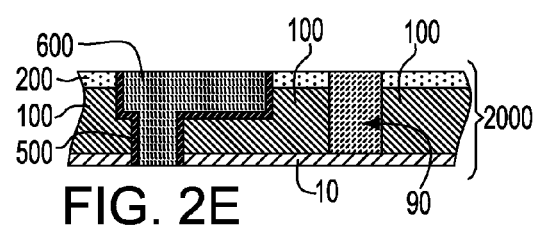
Figure 2B:
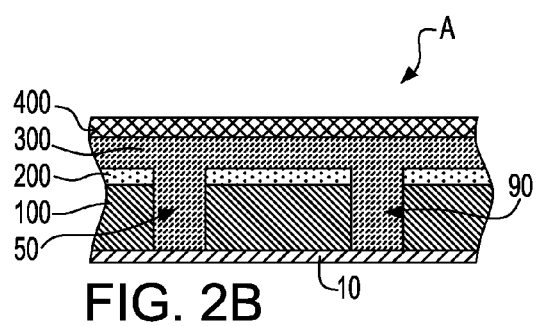
Figure 5A:
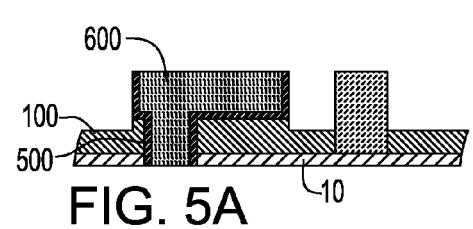
FIGS. 5a and 5b are schematic diagrams which together depict an interconnect structure having airgaps and supporting features of the invention.

The masking step may be implemented by any known lithographic process. FIG. 2b depicts a next step that includes applying a via filling material (300) to interconnect structure A in order to planarize the structure's surface, and to fill both the regions in the interlayer dielectric corresponding to the via features (50) and ternary features (90). Optionally, a hardmask (400) is deposited.

Figure 2C:
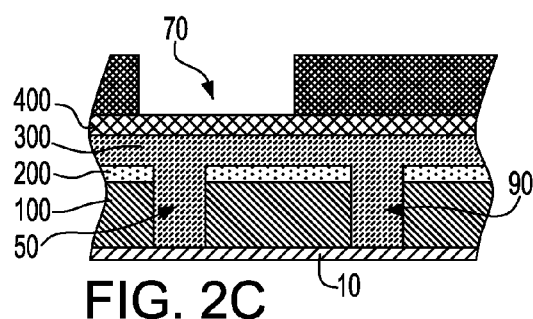
Figure 2D:
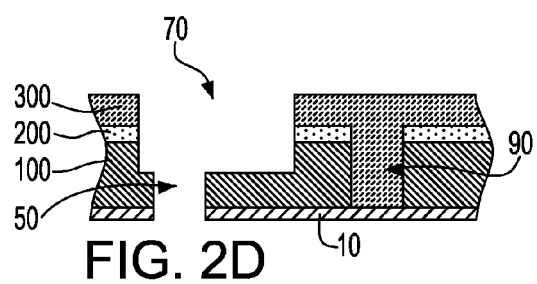

A second lithographic step comprising adding a line pattern (70) is depicted in FIG. 2c. FIG. 2d shows the structure after the line pattern (70) is transferred into the interlayer dielectric (100). The step may be implemented using reactive ion etch processes. It should be noted that the line patterns (70) must always coincide with the via features (50), but not the ternary features (90). Finally, FIG. 2e depicts the interconnect structure A after a step of depositing a metal containing liner (500) and copper (600), including subsequently planarizing the structure by chemical mechanical polishing. As a result of this approach, an interconnect level A having three distinct patterned features (2000) is realized.

Figure 3A:
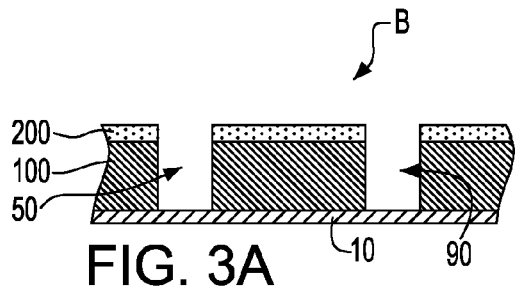
FIGS. 3a-3g are schematic diagrams, which together depict another embodiment of a method for generating a ternary interconnect structure having three structurally distinct features of the invention.
Figure 3F:
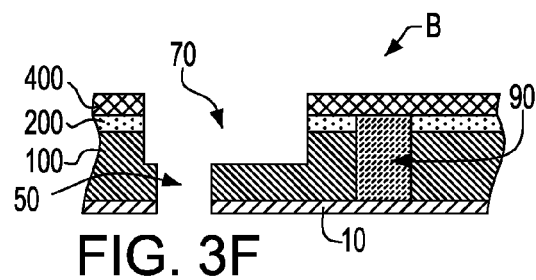
Figure 3B:
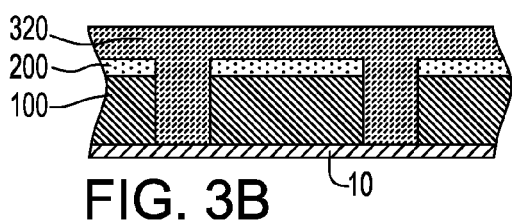

Referring now to FIGS. 3a-3g, another embodiment of the novel process for generating an interconnect structure B of this invention will now be described. Interconnect structure B includes a semiconductor substrate (10), upon which is deposited an interlayer dielectric (100) and optional hard mask (200). A first lithographic step is performed on the structure (B), resulting in a mask formed in the dielectric and hard mask having via features (50) and ternary features (90), as shown in FIG. 3b. The masking step that forms the via and ternary features may be carried out by known lithographic processes. The pattern may be transferred into the interlayer dielectric by reactive ion etch processes. Thereafter, a step that includes applying a via filling material (320) carried out in order to planarize the structure surface and fill regions in the interlayer dielectric corresponding to the via features (50) and ternary features (90). The resulting structure (B) is shown in FIG. 3b.

Figure 3G:
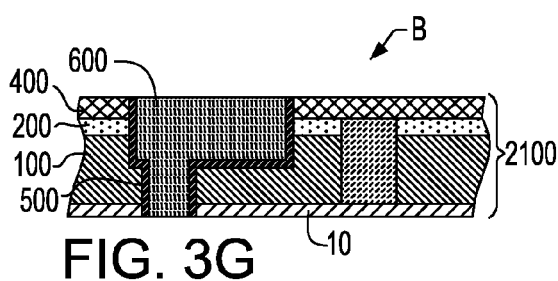
Figure 3C:
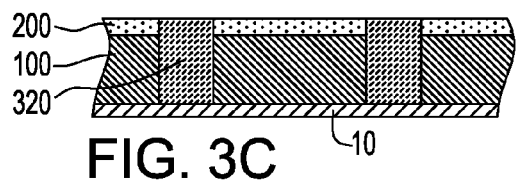
Figure 3D:
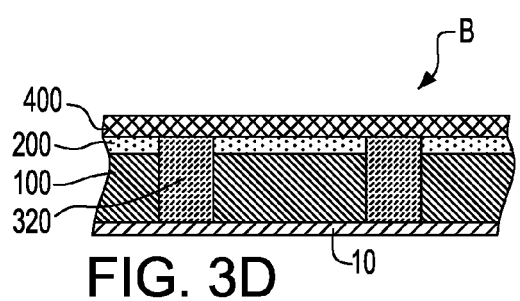
Figure 3E:
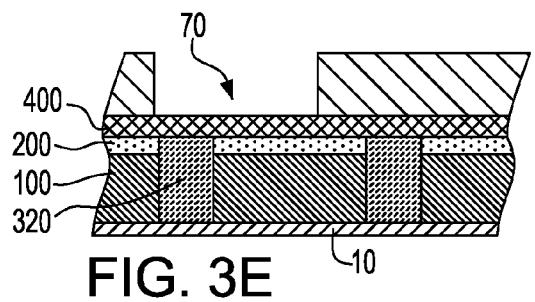

Next, the uppermost portion of the via fill material is removed down to a "dielectric stack" comprising the interlayer dielectric (100) and optional hardmask (200), as shown in FIG. 3c. The step may be carried out using a reactive ion etch process, or using a chemical mechanical polishing process. Optionally, a hardmask (400) can be deposited of the FIG. 3c structure, to realize the structure shown in FIG. 3d. The hardmask (400) may be used to protect the via filling material (100) from subsequent processing steps, particularly where the fill material comprises organic material. A second lithographic step or process is carried out to realize the structure depicted in FIG. 3e. A line pattern (7) is provided on the interconnect structure (B) as shown in FIG. 3e. The line pattern (70) is transferred into the interlayer dielectric using reactive ion etch, the result of which is shown in FIG. 3f. Finally, a metal containing liner (500) and copper (600) is deposited into the structure (B), which is subsequently planarized by chemical mechanical polishing down to the optional hardmask (400) as shown in FIG. 3g (label 400 is missing in FIG. 3g). As a result of this method, the novel interconnect structure (B) of the invention includes an interconnect level having three distinct patterned features (2100) is realized.

Figure 4A:
FIGS. 4a and 4b are schematic diagrams which together show an interconnect structure of the invention having airgaps.
Figure 4B:
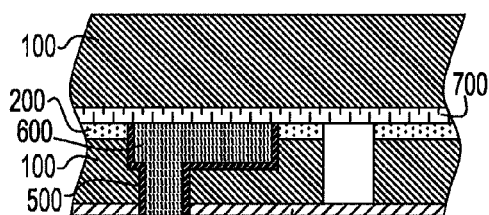

Alternatively, the aforementioned chemical mechanical polishing step may be performed to polish down to the interlayer dielectric (100) and optional hard mask (200) layer, as shown in structure (B') of FIG. 4a (note, label B' is missing from FIG. 4a). Thereafter, a cap barrier (700) may be deposited on the interlayer dielectric (100) and hardmask (200) to serve as a copper and air diffusion barrier (atop the interconnect level (2000 or 2001)) as shown in FIG. 4b. The process may be repeated to form a multilevel interconnect structure comprised of metal lines and vias and the ternary features. For such a multilevel interconnect structure, the ternary feature is preferably comprised of a dielectric that has mechanical properties that are superior to the properties of the interlayer dielectric (100) comprising each layer.

This result is quite important to the interconnect structure, and semiconductor IC within which it is formed because the mechanical strength (e.g., elastic modulus) and film stresses associated with commonly used interlayer dielectrics have been decreasing and increasing, respectively, as the use of interlayer dielectrics with lower dielectric constants and higher porosities is becoming more frequent. Thus, for such an interconnect structure, the ternary feature serves as mechanical support. For that matter, the dielectric may comprise any dielectric known in the art, and for example, may be is spin coated, or deposited by chemical vapor deposition. Examples of common elements that the dielectric may comprise include without limitation: silicon oxide, carbon doped oxides, silsesquioxanes, siloxanes, polycarbosilanes, and polyarylenes.

Figure 5B:
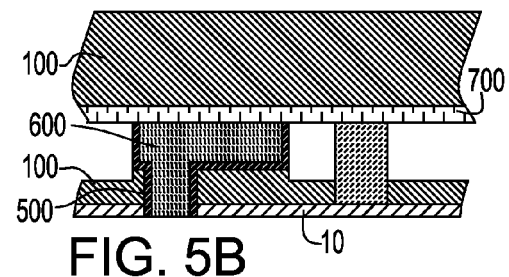

Alternatively, prior to the cap barrier deposition, the interconnect level having three distinct patterned features, e.g., interconnect level (2000) shown in FIG. 2e, may be further processed to generate interconnect structures having airgaps. Airgaps may be formed according to the novel method selectively removing either the ternary feature (90) or interlayer dielectric (100) in a fashion that does not significantly alter the metal lines. This removal may be performed by any process known in the art including reactive ion etching and wet chemical etches. The process may be performed to realize either a complete removal of the intended material, or may be partial, leaving a portion of the material that comprises the ternary structure behind. Subsequently, a cap barrier layer (700) and additional interlayer dielectric layer (100) may be deposited in a manner where airgaps are generated. The result is schematically shown in FIG. 4b for the case where the ternary feature (90) is fully removed, FIG. 5b depicts a case where the interlayer dielectric (100) is partially removed. In the process to realize the structure, the ternary features effectively serve as mechanical supports for the interconnect structure.

In the instance where the ternary feature is not removed or only partially removed, the material comprising the ternary structure may again include silicon oxide, silicon nitride, silicon carbide, hydrogenated silicon nitride, hydrogenated silicon carbide, hydrogenated silicon carbonitride, carbon doped oxides, silsesquioxanes, siloxanes, polycarbosilanes, and polyarylenes. In the case where the ternary feature is completely removed and is consequently sacrificial the material may also include materials that may facilitate easy removal. These include organic polymeric materials that may be removed by solvent-based processes, thermolysis, or plasma stripping. Specific examples of polymeric material may be one of, a combination of, or a copolymer of: poly (stryenes), poly(esters), poly(methacrylates), poly(acrylates), poly(glycols), poly(amides), and poly(norbornenes).

Optionally, the material comprising the ternary feature may be annealed at any step during the integration process and may be performed by at least one of the following: thermal curing, electron irradiation, ion irradiation, irradiation with ultraviolet and/or visible light. Thermal curing may be performed at temperatures between about 50-500° C. and under inert atmospheres, which may be comprised of: nitrogen, argon, helium, hydrogen, and combinations thereof. During annealing, crosslinking mechanisms may occur to improve the mechanical properties.

It should be noted that since the via features (50) and ternary features (90) are defined together in the same mask, there may be significant benefits that result from patterning these features simultaneously. This is due to the issues associated with misalignment and overlay that become considerable when the length scale associated with the lithography become very fine since misalignment can lead to poor reliability, yields, or both. Thus, in contrast to prior art integration approaches that require three masks to generate a ternary structure, the structures contained in this invention are unique as they offer an added benefit of having features with distinct patterns that are perfectly aligned together.

The pattern corresponding to the ternary feature may vary depending on its application and the mechanical attributes of the interconnect structure. For instances where the ternary feature serves as a mechanical support, these features may be placed in areas where mechanical failure is likely or in regions where capacitance is not critical. Conversely, ternary features that are airgaps can be selectively placed in regions where the capacitance between conducing metal features is important and mechanical robustness of the interconnect structure is not compromised.

It should also be noted that this approach may be applied to other dual damascene integration approaches known in the art. This includes interconnect structures having hybrid interlayer dielectrics whereby this layer may be comprised of at least two distinct materials. Also, this approach may also be utilized in via-first partial etch schemes whereby a partial transfer of the pattern having the via and ternary features is first performed into the interlayer dielectric. The via features are then transferred completely through the interlayer dielectric during the transfer of the line pattern into the interlayer dielectric.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

The invention claimed is:

1. An interconnect structure comprising distinct structural elements with different patterns for interconnecting a semiconductor substrate, wherein the structural elements comprise:
    an interlevel layer;
    conducting metal features comprised of conducting metal lines and conducting metal vias, wherein the conducting metal lines are present in the interlevel layer that traverse parallel to the substrate, and conducting metal vias are present through the interlevel layer that traverse orthogonal to the substrate, wherein the conducting metal features have a stepped width within a single dielectric material layer of the interlevel layer; and
    mechanical supports having a greater elastic modulus than the interlevel layer are present through the interlevel layer, wherein the mechanical supports are separated from the conducting metal lines and the conducting metal vias features by a continuous portion of the interlevel layer, wherein the mechanical supports and the conducting metal vias are formed using a same photoresist mask to substantially eliminate misalignment between the mechanical supports and the conducting metal vias.

2. The structure of claim 1, wherein the mechanical supports comprise silicon oxide, silicon nitride, silicon carbide, hydrogenated silicon nitride, hydrogenated silicon carbide, hydrogenated silicon carbonitride, carbon doped oxides, silsesquioxanes, siloxanes, polycarbosilanes, or polyarylenes.

3. The structure of claim 1, wherein the mechanical supports extend throughout an entire interconnect level thickness or only a portion of the interconnect level.

4. The structure of claim 1, further including a dielectric hardmask.

5. The structure of claim 1, further comprising multiple interconnect levels, wherein each level comprises said conducting metal lines, said conducting metal vias, and said mechanical supports.

\* \* \* \* \*